(12) United States Patent
Coffey et al.

(10) Patent No.: US 8,874,814 B2
(45) Date of Patent: Oct. 28, 2014

(54) SWITCH-STATE INFORMATION AGGREGATION

(75) Inventors: Joseph C. Coffey, Burnsville, MN (US); Nasser Pooladian, Roseville, MN (US)

(73) Assignee: ADC Telecommunications, Inc., Shakopee, MN (US)

( * ) Notice: Subject to any disclaimer, the term of this patent is extended or adjusted under 35 U.S.C. 154(b) by 522 days.

(21) Appl. No.: 13/157,519

(22) Filed: Jun. 10, 2011

(65) Prior Publication Data
US 2012/0023276 A1 Jan. 26, 2012

Related U.S. Application Data

(60) Provisional application No. 61/353,906, filed on Jun. 11, 2010.

(51) Int. Cl.
*G06F 3/00* (2006.01)
*G06F 13/12* (2006.01)
*G06F 5/00* (2006.01)
*H03M 11/24* (2006.01)

(52) U.S. Cl.
CPC .................................... *H03M 11/24* (2013.01)
USPC .................................. 710/69; 710/15; 710/51

(58) Field of Classification Search
None
See application file for complete search history.

(56) References Cited

U.S. PATENT DOCUMENTS

| 5,052,940 A | 10/1991 | Bengal |
| 5,161,988 A | 11/1992 | Krupka |
| 5,195,902 A | 3/1993 | Bengal |
| 5,394,503 A | 2/1995 | Dietz, Jr. et al. |
| 5,418,334 A | 5/1995 | Williams |
| 5,420,512 A | 5/1995 | Spillane et al. |
| 5,448,675 A | 9/1995 | Leone et al. |
| 5,461,693 A | 10/1995 | Pimpinella |
| 5,463,706 A | 10/1995 | Dumont et al. |
| 5,473,715 A | 12/1995 | Schofield et al. |
| 5,483,467 A | 1/1996 | Krupka |
| 5,487,666 A | 1/1996 | DiGiovanni |
| 5,541,586 A | 7/1996 | Wise |
| 5,550,755 A | 8/1996 | Martin et al. |
| 5,606,664 A | 2/1997 | Brown et al. |

(Continued)

FOREIGN PATENT DOCUMENTS

| EP | 1569494 | 8/2005 |
| JP | 2001297044 | 10/2001 |
| KR | 102008017170 | 2/2008 |

OTHER PUBLICATIONS

International Preliminary Examining Authority, "International Preliminary Report on Patentability", "from Foreign Counterpart of U.S. Appl. No. 13/157,519", Dec. 27, 2012, pp. 1-9, Published in: WO.

(Continued)

*Primary Examiner* — Zachary K Huson
(74) *Attorney, Agent, or Firm* — Fogg & Powers LLC

(57) ABSTRACT

One switch-state aggregation technique uses a digital-to-analog converter in combination with an analog-to-digital converter to aggregate the state of a plurality of switches. Another switch-state aggregation technique uses input/output lines of a processor to aggregate the state of a plurality of switches and to communicate data other than the state of the switches. These techniques can be used to aggregate information about whether a plug or other connector is inserted into the ports of a patch panel or other telecommunication or communication assembly, system, or device.

30 Claims, 10 Drawing Sheets

(56) References Cited

U.S. PATENT DOCUMENTS

| | | | |
|---|---|---|---|
| 5,764,043 | A | 6/1998 | Czosnowski et al. |
| 5,832,071 | A | 11/1998 | Voelker |
| 5,854,824 | A | 12/1998 | Bengal et al. |
| 5,876,240 | A | 3/1999 | Derstine et al. |
| 6,002,331 | A | 12/1999 | Laor |
| 6,222,908 | B1 | 4/2001 | Bartolutti et al. |
| 6,234,830 | B1 | 5/2001 | Ensz et al. |
| 6,238,235 | B1 | 5/2001 | Shavit et al. |
| 6,285,293 | B1 | 9/2001 | German et al. |
| 6,300,877 | B1 | 10/2001 | Schannach et al. |
| 6,330,307 | B1 | 12/2001 | Bloch et al. |
| 6,350,148 | B1 | 2/2002 | Bartolutti et al. |
| 6,359,859 | B1 | 3/2002 | Brolin et al. |
| 6,424,710 | B1 | 7/2002 | Bartolutti et al. |
| 6,499,861 | B1 | 12/2002 | German et al. |
| 6,522,737 | B1 | 2/2003 | Bartolutti et al. |
| 6,574,586 | B1 | 6/2003 | David et al. |
| 6,577,243 | B1 | 6/2003 | Dannenmann et al. |
| 6,636,152 | B2 | 10/2003 | Schannach et al. |
| 6,684,179 | B1 | 1/2004 | David |
| 6,725,177 | B2 | 4/2004 | David et al. |
| D510,068 | S | 9/2005 | Haggay et al. |
| 6,961,675 | B2 | 11/2005 | David |
| 6,968,994 | B1 | 11/2005 | Ashwood Smith |
| 6,976,867 | B2 | 12/2005 | Navarro et al. |
| 7,038,135 | B1 | 5/2006 | Chan et al. |
| 7,042,562 | B2 | 5/2006 | Kiani et al. |
| 7,077,710 | B2 | 7/2006 | Haggay et al. |
| 7,081,808 | B2 | 7/2006 | Colombo et al. |
| 7,123,810 | B2 | 10/2006 | Parrish |
| 7,153,142 | B2 | 12/2006 | Shifris et al. |
| 7,160,143 | B2 | 1/2007 | David et al. |
| 7,193,422 | B2 | 3/2007 | Velleca et al. |
| 7,226,217 | B1 | 6/2007 | Benton et al. |
| 7,229,020 | B2 | 6/2007 | Goodison et al. |
| 7,234,944 | B2 | 6/2007 | Nordin et al. |
| 7,289,334 | B2 | 10/2007 | Behrens et al. |
| 7,297,018 | B2 | 11/2007 | Caveney et al. |
| 7,312,715 | B2 | 12/2007 | Shalts et al. |
| D559,186 | S | 1/2008 | Kelmer |
| 7,315,224 | B2 | 1/2008 | Gurovich et al. |
| D564,966 | S | 3/2008 | Shifris |
| 7,352,289 | B1 | 4/2008 | Harris |
| 7,377,819 | B1 | 5/2008 | Cooper et al. |
| 7,401,985 | B2 | 7/2008 | Aronson et al. |
| D575,743 | S | 8/2008 | Shifris et al. |
| 7,411,405 | B2 | 8/2008 | Nordin |
| 7,445,389 | B2 | 11/2008 | Aronson |
| 7,468,669 | B1 | 12/2008 | Beck et al. |
| 7,479,032 | B2 | 1/2009 | Hoath et al. |
| 7,499,616 | B2 | 3/2009 | Aronson et al. |
| 7,517,243 | B2 | 4/2009 | Caveney et al. |
| 7,540,667 | B2 | 6/2009 | Murano |
| 7,551,456 | B2 | 6/2009 | Behrens et al. |
| 7,564,795 | B2 | 7/2009 | Stephenson et al. |
| 2003/0231130 | A1 | 12/2003 | Confalonieri et al. |
| 2004/0008136 | A1 | 1/2004 | Reyneri et al. |
| 2005/0164548 | A1 | 7/2005 | Spears et al. |
| 2005/0169024 | A1 | 8/2005 | Dwarakanath et al. |
| 2005/0186819 | A1 | 8/2005 | Velleca et al. |
| 2005/0190768 | A1 | 9/2005 | Cutler |
| 2006/0059293 | A1 | 3/2006 | Wurzburg et al. |
| 2006/0160395 | A1 | 7/2006 | Macauley et al. |
| 2006/0160396 | A1 | 7/2006 | Macauley et al. |
| 2006/0179144 | A1 | 8/2006 | Nagase |
| 2006/0203715 | A1 | 9/2006 | Hunter et al. |
| 2006/0227759 | A1 | 10/2006 | Bohm et al. |
| 2006/0268507 | A1 | 11/2006 | Takahashi |
| 2007/0025306 | A1 | 2/2007 | Cox et al. |
| 2007/0058338 | A1 | 3/2007 | Lee |
| 2007/0117444 | A1 | 5/2007 | Caveney et al. |
| 2007/0162954 | A1 | 7/2007 | Pela |
| 2007/0230452 | A1 | 10/2007 | Hough et al. |
| 2007/0274234 | A1 | 11/2007 | Kubota |
| 2009/0040079 | A1 | 2/2009 | Sutardja |
| 2009/0098763 | A1 | 4/2009 | Below et al. |
| 2010/0021164 | A1 | 1/2010 | Luk |
| 2010/0184323 | A1* | 7/2010 | Patel et al. ............. 439/490 |
| 2010/0211665 | A1 | 8/2010 | Raza |
| 2010/0211697 | A1 | 8/2010 | Raza |
| 2010/0215049 | A1 | 8/2010 | Raza |
| 2011/0092100 | A1 | 4/2011 | Coffey |
| 2011/0115494 | A1 | 5/2011 | Taylor |
| 2011/0116748 | A1 | 5/2011 | Smrha |

OTHER PUBLICATIONS

"IntelliMAC", 2003, pp. 1-6, Publisher: Nordx/CDT.

Kang et al., "Design and Implementation of Network Management System for Power Line Communication Network", "IEEE International Symposium on Power Line Communications and its Applications (ISPLC 2007)", Mar. 28, 2007, pp. 23-28, Publisher: IEEE.

Meredith, "Managers Missing Point of Intelligent Patching", "http://searchdatacenter.techtarget.com/news/article/0,289142,sid80_gci1099991,00.html", Jun. 21, 2005, pp. 1-2, Publisher: SearchDataCenter.com.

Milligan, "Intelligent Patching Systems Carving Out a 'Large' Niche", "http://www.cablinginstall.com/index/display/article-display/207641/articles/cabling-installation-maintenance/volume-12/issue-7/contents/technology/int", Jul. 1, 2004, pp. 1-6, vol. 12, No. 7, Publisher: Cabling Installation & Maintenance.

Feltgen, "PCT Patent Application PCT/EP2009/009036: Method and Arrangement for Identifying at Least One Object", Dec. 16, 2009, pp. 1-25, Published in: WO.

"Communications Bladed Panel Systems", "U.S. Appl. No. 13/025,730, filed Feb. 11, 2011".

"Communications Bladed Panel Systems", "U.S. Appl. No. 13/025,737, filed Feb. 11, 2011".

"Commuinications Bladed Panel System", "U.S. Appl. No. 13/025,743, filed Feb. 11, 2011".

"Communications Bladed Panel Systems", "U.S. Appl. No. 13/025,750, filed Feb. 11, 2011".

"Managed Fiber Connectivity Systems", "U.S. Appl. No. 13/025,784, filed Feb. 11, 2011".

"Managed Fiber Connectivity Systems", "U.S. Appl. No. 13/025,788, filed Feb. 11, 2011".

"Managed Fiber Connectivity Systems", "U.S. Appl. No. 13/025,797, filed Feb. 11, 2011".

"Managed Fiber Connectivity Csystems", "U.S. Appl. No. 13/025,841, filed Feb. 11, 2011".

Raza, "Managed Connectivity Systems and Methods", "U.S. Appl. No. 61/152,624, filed Feb. 13, 2011".

Smrha, "Managed Connectivity in Fiber Optic Systems and Methods Thereof", "U.S. Appl. No. 61/252,386, filed Oct. 16, 2009".

Coffey, "Managed Connectivity in Electrical Systems and Methods Thereof", "U.S. Appl. No. 61/252,395, filed Oct. 16, 2009".

Taylor, "Electrical Plug for Managed Connectivity Systems", "U.S. Appl. No. 61/252,964, filed Oct. 19, 2009".

Taylor, "Electrical Plug for Managed Connectivity Systems", "U.S. Appl. No. 61/253,208, filed Oct. 20, 2009".

"Panel Including Blade Feature for Managed Connectivity", "U.S. Appl. No. 61/303,948, filed Feb. 12, 2010".

"Panel Including Blade Feature for Managed Connectivity", "U.S. Appl. No. 61/303,961, filed Feb. 12, 2010".

"Fiber Plugs and Adapters for Managed Connectivity", "U.S. Appl. No. 61/413,828, filed Nov. 15, 2010".

"Communications Bladed Panel Systems", "U.S. Appl. No. 61/413,844, filed Nov. 15, 2010".

"Cable Management in Rack Systems", Nov. 15, 2010.

"Fiber Plugs and Adapters for Managed Connectivity", "U.S. Appl. No. 61/437,504, filed Jan. 28, 2011".

"Communications Bladed Panel Systems", "U.S. Appl. No. 61/439,693, filed Feb. 4, 2011".

"Cable Management in Rack Systems", "US Application No. 618/466,696, filed Mar. 23, 2011".

Anne, "Double-Buffer Insertion Count Stored in a Device Attached to a Physical Layer Medium", "U.S. Appl. No. 61/467,715, filed Apr. 15, 2011".

(56) References Cited

OTHER PUBLICATIONS

Anne, "Dynamically Detecting a Defective Connector at a Port", "U.S. Appl. No. 61/467,725, filed Mar. 25, 2011".
Sybesma, "Identifier Encoding Scheme for Use With Multi-Path Connectors", "U.S. Appl. No. 61/467,729, filed Mar. 25, 2011".
Sybesma, "Systems and Method for Utilizing Variable Length Data Field Storage Schemes on Physical Communication Media Segments", "U.S. Appl. No. 61/467,736, filed Mar. 25, 2011".
Sybesma, "Event-Monitoring in a System for Automatically Obtaining and Managing Physical Layer Information Using a Reliable Packet", "U.S. Appl. No. 61/467,743, filed Mar. 25, 2011".
International Searching Authority, "International Search Report", Mailed Jan. 18, 2012, Published in: WO.
State Intellectual Property Office, P.R. China, "First Office Action from CN Application No. 201180039312.8 mailed Jun. 30, 2014", "from Foreign Counterpart of U.S. Appl. No. 13/157,519", Jun. 30, 2014, pp. 1-30, Published in: CN.

* cited by examiner

SWITCH-STATE INFORMATION AGGREGATION

CROSS-REFERENCE TO RELATED APPLICATIONS

This application claims the benefit of U.S. Provisional Patent Application Ser. No. 61/353,906, filed Jun. 11, 2010, titled "SWITCH-STATE INFORMATION AGGREGATION", which is hereby incorporated herein by reference.

This application is related to: U.S. Provisional Patent Application Ser. No. 61/152,624, filed on Feb. 13, 2009, titled "MANAGED CONNECTIVITY SYSTEMS AND METHODS" (also referred to here as the "'624 Application"); U.S. patent application Ser. No. 12/705,497, filed on Feb. 12, 2010, titled "AGGREGATION OF PHYSICAL LAYER INFORMATION RELATED TO A NETWORK" (also referred to here as the '497 application); U.S. patent application Ser. No. 12/705,501, filed on Feb. 12, 2010, titled "INTERNETWORKING DEVICES FOR USE WITH PHYSICAL LAYER INFORMATION" (also referred to here as the '501 application); U.S. patent application Ser. No. 12/705,506, filed on Feb. 12, 2010, titled "NETWORK MANAGEMENT SYSTEMS FOR USE WITH PHYSICAL LAYER INFORMATION" (also referred to here as the '506 application); U.S. patent application Ser. No. 12/705,514, filed on Feb. 12, 2010, titled "MANAGED CONNECTIVITY DEVICES, SYSTEMS, AND METHODS" (also referred to here as the '514 application); U.S. Provisional Patent Application Ser. No. 61/252,395, filed on Oct. 16, 2009, titled "MANAGED CONNECTIVITY IN ELECTRICAL SYSTEMS AND METHODS THEREOF" (also referred to here as the "'395 application"); U.S. Provisional Patent Application Ser. No. 61/253,208, filed on Oct. 20, 2009, titled "ELECTRICAL PLUG FOR MANAGED CONNECTIVITY SYSTEMS" (also referred to here as the "'208 application"); U.S. Provisional Patent Application Ser. No. 61/252,964, filed on Oct. 19, 2009, titled "ELECTRICAL PLUG FOR MANAGED CONNECTIVITY SYSTEMS" (also referred to here as the "'964 application"); U.S. Provisional Patent Application Ser. No. 61/252,386, filed on Oct. 16, 2009, titled "MANAGED CONNECTIVITY IN FIBER OPTIC SYSTEMS AND METHODS THEREOF" (also referred to here as the "'386 application"); U.S. Provisional Patent Application Ser. No. 61/303,961, filed on Feb. 12, 2010, titled "FIBER PLUGS AND ADAPTERS FOR MANAGED CONNECTIVITY" (the "'961 application"); and U.S. Provisional Patent Application Ser. No. 61/303,948, filed on Feb. 12, 2010, titled "BLADED COMMUNICATIONS SYSTEM" (the "'948 application").

BACKGROUND

In some applications, the state of several switches needs to be monitored. Typically, in such applications, there are one or more separate input/output (I/O) lines for each switch that connect that switch to a microprocessor or controller. Each such I/O line is coupled to a respective I/O interface of the microprocessor. The microprocessor monitors the state of the switches by polling each of the switches to check the state of the switches.

When a large number of switches are monitored (for example, a number of switches that exceeds the number of microprocessor I/O interfaces available for use with such switches), an I/O expander or a programmable logic device (PLD) can be used to share the microprocessor I/O interfaces among the monitored switches. However, the microprocessor typically must implement a protocol for interacting with the I/O expander or PLD and for addressing the individual switches. Also, the amount of time required for the microprocessor to poll all of the switches through an I/O expander or PLD may be undesirable or unacceptable for some applications.

Also, the I/O interface that is used to monitor the state of the switch is typically not able to be used for other purposes. For example, where one state of each switch is used to determine when to read from or write to a memory device associated with that switch, another I/O interface or line would typically be needed for the microprocessor to read from or write to the memory device.

SUMMARY

One exemplary embodiment is directed to a system that comprises a plurality of switches, each having a respective logical binary state. The system further comprises a programmable processor to monitor the state of the plurality of switches. The system further comprises a digital-to-analog converter that converts a binary code presented on inputs of the digital-to-analog converter into an analog signal proportional to the binary code. The system is configured so that each of at least some of the inputs of the digital-to-analog converter is coupled to a respective one of the plurality of switches such that each such input is indicative of the state of the respective switch coupled thereto. The state of the plurality of switches is communicated to the programmable processor at least in part using the analog signal output by the digital-to-analog converter. An analog-to-digital conversion is performed on the analog signal output by the digital-to-analog converter to produce a digital representation of the state of the plurality of switches.

Another exemplary embodiment is directed to a system that comprises a plurality of switches, each having a respective logical binary state. The system further comprises a programmable processor to monitor the state of the plurality of switches, the programmable processor comprising a plurality of input/output lines. Each of the plurality of switches is coupled to a respective input/output line. For each of the plurality of switches, the system is configured to develop a first logic state on the input/output line associated with that switch when that switch is in a first switch state. For each of the plurality of switches, the system is configured to develop a second logic state on the input/output line associated with that switch when that switch is in a second switch state. The system is further configured to enable data other than the first and second logic states to be communicated over the input/output lines.

DRAWINGS

DETAILED DESCRIPTION

Figure 1:
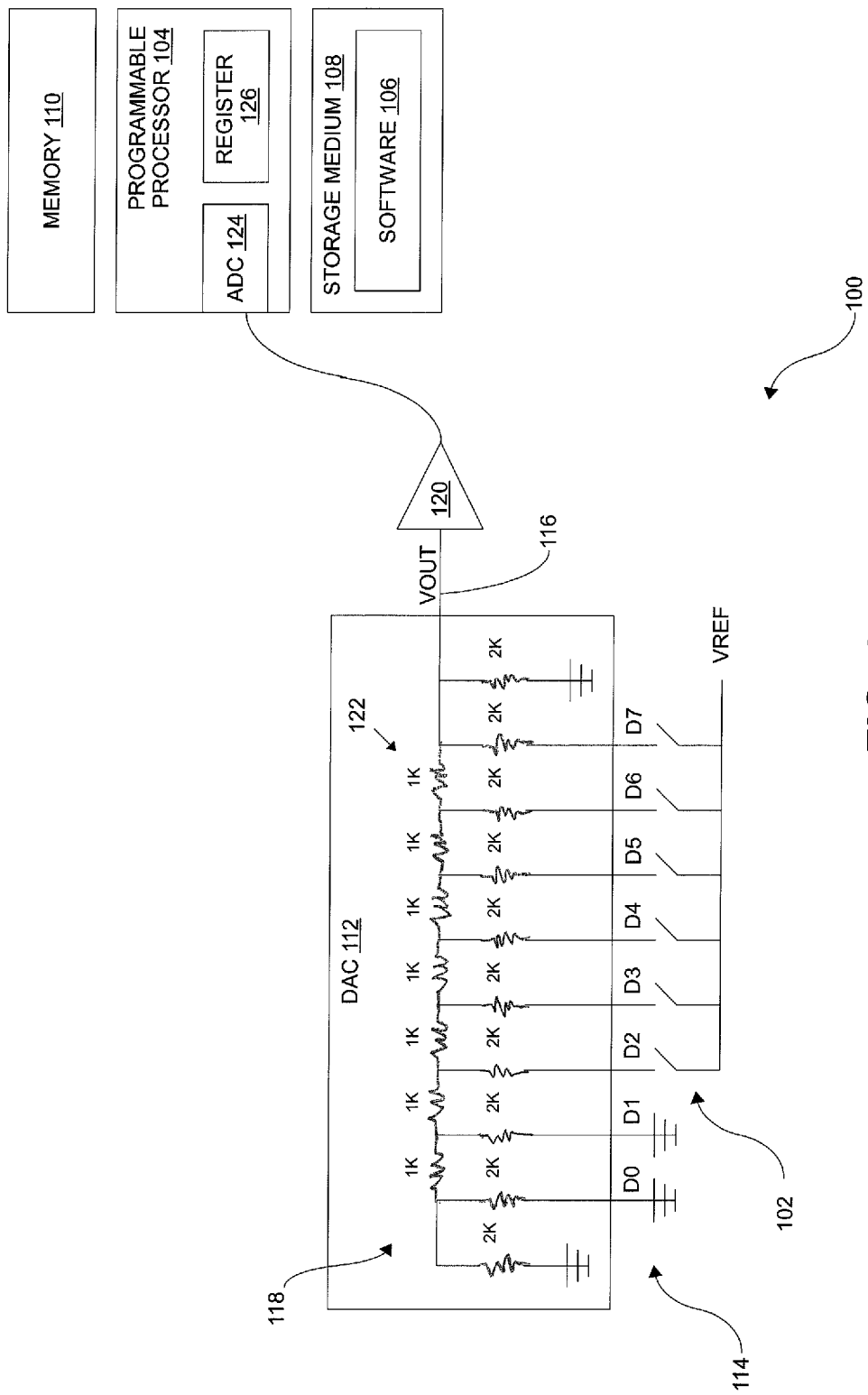
FIG. 1 is a block diagram of one embodiment of a system that is configured to monitor the state of a plurality of switches.

FIG. 1 is a block diagram of one embodiment of a system 100 that is configured to monitor the state of a plurality of switches 102. As used herein, a "switch" refers to any component or device that is actuated (or otherwise switched) between two logical states (for example, a logical "open" state and a logical "closed" state, a logical "on" state and a logical "off" state, or a logical "0" state and a logical "1" state). These states of the switch are also referred to here as "switch states". During operation, each of the switches 102 has a respective logical binary state that is one of the two logical states.

Examples of switches include, without limitation, electro-mechanical switches such as a single-pole, single-throw (SPST) switch or a shorting contact on an electronic component or sub-assembly that completes a circuit upon insertion into an assembly, and fully electronic switches such as an operational amplifier output, a metal-oxide-semiconductor field-effect transistor (MOSFET), or a logical gate.

In the system 100 shown in FIG. 1, a programmable processor 104 executes software 106 for, among other things, monitoring the state of the plurality of switches 102. The software 106 comprises program instructions that are stored (or otherwise embodied) on or in an appropriate non-transitory storage medium or media 108 (such as flash or other non-volatile memory, magnetic disc drives, and/or optical disc drives) from which at least a portion of the program instructions are read by the programmable processor 104 for execution thereby. The storage medium 108 on or in which the program instructions are embodied is also referred to here as a "program product". Although the storage medium 108 is shown in FIG. 1 as being included in, and local to, the system 100, it is to be understood that removable media and/or remote storage media (for example, storage media that is accessible over a network) can also be used. The system 100 also includes memory 110 for storing the program instructions (and any related data) during execution by the programmable processor 104. Memory 110 comprises, in one implementation, any suitable form of random access memory (RAM) now known or later developed, such as dynamic random access memory (DRAM). In other embodiments, other types of memory are used.

The system further comprises a digital-to-analog converter (DAC) 112. The DAC 112 converts a binary code presented on its inputs 114 into an analog signal that is proportional to the binary code. That is, the inputs 114 of the DAC 112 correspond to the binary digits of the binary code that is presented to the DAC 112. The analog signal is output on the voltage output (VOUT) 116 of the DAC 112. At least some of the inputs 114 of the digital-to-analog converter 112 are coupled to a respective one of the plurality of switches 102 such that each such input 114 is indicative of the state of the respective switch 102 coupled to that input 114. In this way, the binary code that is presented on the inputs 114 of the DAC 112 is indicative of the state of the switches 102.

In the particular embodiment shown in FIG. 1, an 8-bit, voltage-mode, parallel DAC is used. The DAC 112 has eight inputs 114, which are referred to here individually as D0, D1, D2, D3, D4, D5, D6, and D7. Also, in this embodiment, six switches 102 are shown. Inputs D0 and D1 are coupled to ground while inputs D1, D2, D3, D4, D5, D6, and D7 are coupled to a respective one of the six switches 102. The switches 102 are configured so that, when the switch 102 is in a first state, a first digital voltage level (VREF) corresponding to a digital "1" is presented on the respective input 114 of the DAC 112 and, when the switch 102 is in a second state, a second digital voltage level corresponding to a digital "0" is presented on the respective input 114 of the switch 102.

Inputs D0 and D1 are coupled to ground in order to improve the noise sensitivity of the system 100 because the smaller voltage weights given to inputs D0 and D1 are not used (and need not be detected by the ADC 124 described below). However, in other embodiments, all of the inputs of the DAC are coupled to switches.

In the embodiment shown in FIG. 1, the DAC 112 comprises a R2R resistor ladder 118, the output 116 of which is connected to the input of a unity gain buffer amplifier 120. The R2R resistor ladder 118 is provided with two reference voltage supply levels (in this embodiment, VREF (which is associated with a logical "1") and ground (which is associated with a logical "0"), which are the "rails" of the R2R resistor ladder 118. The R2R resistor ladder 118 comprises a respective resistor stage 122 for each of the binary inputs D0, D1, D2, D3, D4, D5, D6, and D7, which provides an appropriate weighting for each binary input's contribution to the output voltage VOUT.

Table 1 shows the corresponding voltage weight associated with each binary digit of the binary code presented on the inputs 114 of the DAC 112, where input D0 is the least significant bit (LSB), input D7 is the most significant bit (MSB), VREF is equal to 5 Volts, and the resistors in the RSR resistor ladder 118 have the values shown in FIG. 1.

TABLE 1

| INPUT | OUTPUT VOLTAGE CONTRIBUTION |
|---|---|
| D0 | 13 millivolts (Least Significant Bit) |
| D1 | 26 millivolts |
| D2 | 52 millivolts |
| D3 | 104 millivolts |
| D4 | 208 millivolts |
| D5 | 416 millivolts |
| D6 | 833 millivolts |
| D7 | 1.67 Volts (Most Significant Bit) |

Figure 2:
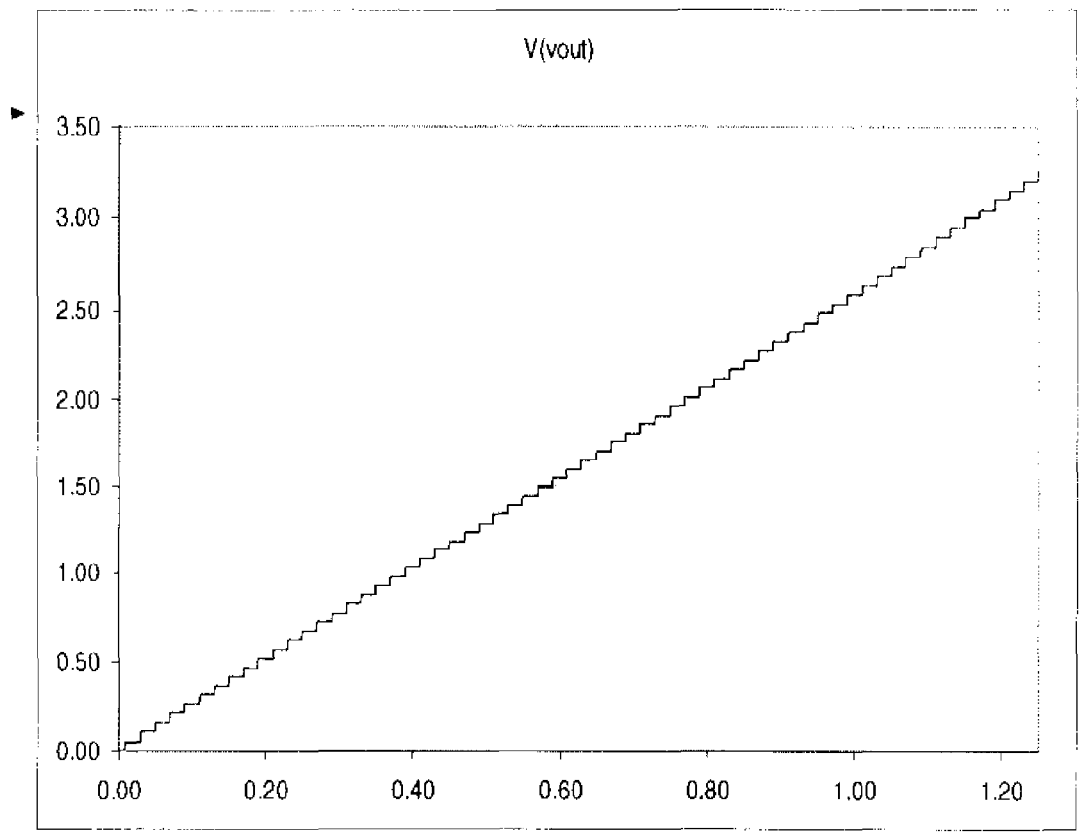
FIG. 2 is a graph showing the corresponding output voltage for each of the 256 possible binary codes that can be presented on the inputs of the DAC shown in FIG. 1.

FIG. 2 is a graph showing the corresponding output voltage VOUT for each of the 256 possible binary codes that can be presented on the inputs 114 of the DAC 112. For example, if the switches 102 associated with inputs D7, D6 and D2 are in the state that is associated with the binary value "1" (for example, if those switches 102 are closed) and the switches 102 associated with inputs D5, D4, and D3 are in the state that is associated with the binary value "0" (for example, if those switches 102 are open), and the inputs D1 and D0 are connected to ground, then the binary code "11000100" is presented on the inputs 114 of the DAC 112. In response to that binary code being presented on the inputs 114 of the DAC 112, the DAC 112 outputs an analog signal having an output voltage of 2.555 Volts, which is 1×1.67 Volts+1×833 millivolts+0×416 millivolts+0×208 millivolts+0×104 millivolts+1×52 millivolts+0×26 millivolts+0×13 millivolts.

The unity gain buffer amplifier 120 shown in FIG. 1 can be implemented, for example, by connecting the output VOUT of the DAC 112 to the non-inverting input of an operational amplifier whose output is tied back to the inverting input of the operational amplifier.

The analog output of the unity gain buffer amplifier 120 is input to an analog-to-digital converter (ADC) 124, which converts the analog output back to a binary code proportional to the analog signal output by the DAC 112. The binary code that is output by the ADC 124 is a digital representation of the state of the switches 102. In the particular embodiment shown in FIG. 1, the programmable processor 104 includes the ADC 124 (though in other embodiment an external ADC can be used). The programmable processor 104 periodically updates the contents of a register 126 with the binary code that is output by the ADC 124. Software 106 executing on the programmable processor 104 monitors the state of the plurality of switches 102 by monitoring the state of the register 126. As a result, the software 106 need not scan the individual switches 102 in order to monitor the state of the switches 102.

Figure 3:
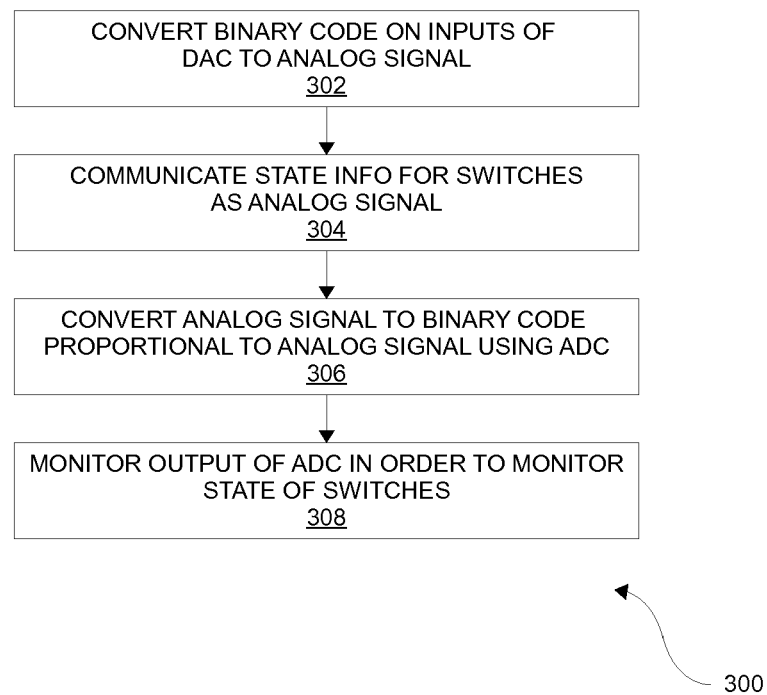
FIG. 3 is a flow diagram of one embodiment of a method of monitoring the state of a plurality of switches.

FIG. 3 is a flow diagram of one embodiment of a method 300 of monitoring the state of a plurality of switches. The embodiment of method 300 shown in FIG. 3 is described here as being implemented in the system 100 of FIG. 1 in order to aggregate state information for the plurality of switches 102, though other embodiments can be implemented in other ways.

Method 300 comprises converting a binary code presented on the inputs 114 of the DAC 112 to an analog signal proportional to the binary code (block 302). As noted above, the binary code that is presented on the inputs of the DAC 112 is made up of eight binary values, where the binary values presented on the inputs D2, D3, D4, D5, D6, and D7 are indicative of the state of a respective one of the plurality of switches 102. The inputs D0 and D1 are connected to ground (that is, the binary value "0") in order to improve noise sensitivity.

For example, if the switches 102 associated with inputs D7, D6 and D2 are in the state that is associated with the binary value "1" (for example, if those switches 102 are closed), the switches 102 associated with inputs D5, D4, and D3 are in the state that is associated with the binary value "0" (for example, if those switches 102 are open), and the inputs D1 and D0 are connected to ground, then the binary code "11000100" is presented on the inputs 114 of the DAC 112. In response to that binary code being presented on the inputs of the DAC 112, the DAC 112 would output an analog signal having an output voltage of 2.555 Volts, which is 1×1.67 Volts+1×833 millivolts+0×416 millivolts+0×208 millivolts+0×104 millivolts+1×52 millivolts+0×26 millivolts+0×13 millivolts.

Method 300 further comprises communicating state information for the plurality of switches 102 using the analog signal (block 304). In the particular embodiment described here in connection with FIGS. 1-3, the output of the DAC 112 is the buffered and amplified by the unity gain buffer amplifier 120. The resulting amplified analog signal (and the aggregated state information for the plurality of switches 102 that it represents) is communicated to the ADC 124 included in the programmable processor 104.

Method 300 further comprises converting the analog signal to a binary code proportional to the analog output using the ADC 124 (block 306). The binary code that is output by the ADC 124 is a digital representation of the state of the switches 102. In the particular embodiment described here in connection with FIGS. 1-3, the programmable processor 104 includes the ADC 124, though in other embodiment an external ADC can be used. The programmable processor 104 periodically updates the contents of the register 126 with the binary code that is output by the ADC 124. For example, the ADC 124, upon receiving an analog signal output from that DAC 112 having a voltage of 2.555 Volts, would reconstruct the binary code "11000100" from that analog output and place it into the register 126.

Method 300 further comprises monitoring the output of the ADC 124 in order to monitor the state of the plurality of switches 102 (block 308). In the particular embodiment described here in connection with FIGS. 1-3, software 106 executing on the programmable processor 104 monitors the state of the plurality of switches 102 by monitoring the contents of the register 126. For example, when a bit in the register 126 changes, that indicates that the state of the corresponding switch 102 has changed.

With the embodiment described here in connection with FIGS. 1-3, only the analog signal output by the unity gain buffer amplifier 120 need be communicated to the ADC 124 in the programmable processor 104 in order to provide it with state information for all of the switches 102 (as opposed to having to provide a separate signal for each of the plurality of switches 102 and/or using an I/O expander or PLD). Also, by monitoring the register 126, the software 106 executing on the programmable processor 104 can monitor the state of the switches 102 without having to scan or poll the individual switches 102.

In the embodiment described in connection with FIGS. 1-3, an 8-bit, parallel DAC having a voltage (amplitude) output is used. In other embodiments, however, other types of DACs are used. For example, a digital-to-analog converter having a different resolution, a serial input interface, and/or an analog output with a different attribute that is proportional to the binary code presented on the inputs (for example, a voltage attribute other than amplitude (such as a pulse width) that is proportional to the binary code presented on the inputs or a current attribute that is proportional to the binary code presented on the inputs).

Also, in the embodiment described in connection with FIGS. 1-3, the ADC 124 is a part of the programmable processor 104. In other embodiments, the ADC 124 is separate from the programmable processor, in which case the output of the ADC 124 is provided on an appropriate input or inputs to the programmable processor.

Furthermore, in the embodiment described in connection with FIGS. 1-3, less than all of the inputs 114 of the DAC 112 are coupled to switches 102 in order to improve noise sensitivity. However, in other embodiments, all of the inputs of the DAC are coupled to switches. Also, although a single DAC 112 and single ADC 124 are used in the embodiment described in connection with FIGS. 1-3, in other embodiments multiple digital-to-analog converters and/or multiple analog-to-digital converters are used.

The switch state aggregation techniques described above can be used in a variety of applications to aggregate and monitor switch-state information.

Figure 4:
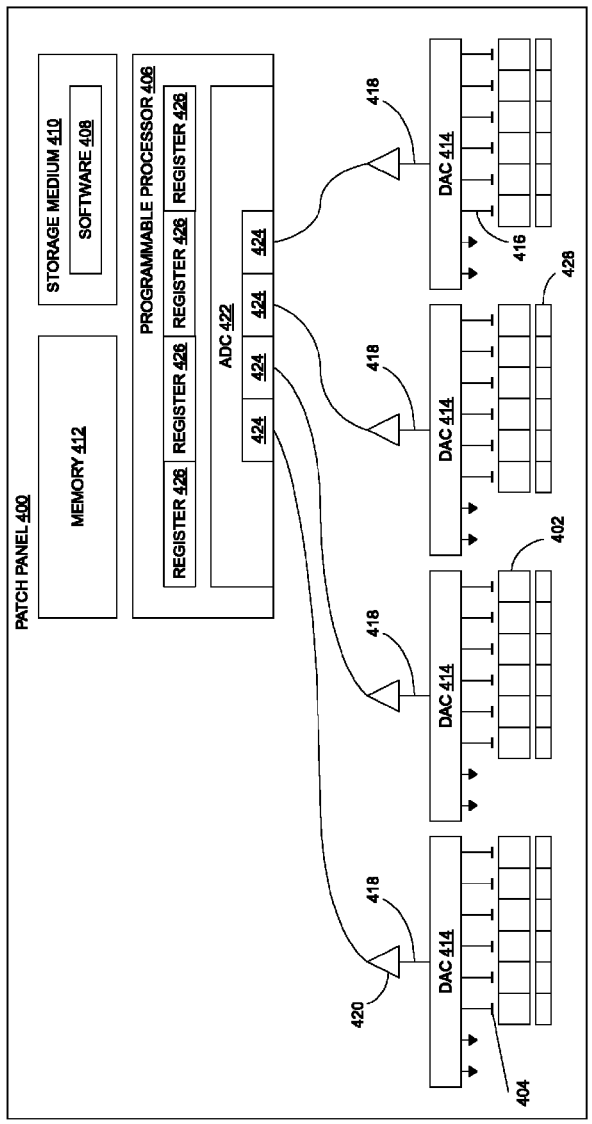
FIG. 4 is a block diagram of one embodiment of a patch panel that uses the switch-state aggregation techniques described above.

FIG. 4 is a block diagram of one embodiment of a patch panel 400 that uses the switch-state aggregation techniques described above. The patch panel 400 is typically mounted (along with other patch panels) in a rack located, for example, in a telecommunications closet, server room, or data center. The patch panel 400 comprises a plurality of ports 402.

Each port 402 is configured to attach a cable (or other segment of communication media) to the port 402 in a semi-permanent manner. As used herein, a "semi-permanent" attachment is one that is designed to be changed relatively infrequently, if ever. This is also referred to sometimes as a "one-time" connection. Such a cable is also referred to here as a "fixed" cable. Such connections can be made using punch-down blocks (in the case of copper communication media) and fiber adapters, fiber splice points, and fiber termination points (in the case of fiber communication media).

Each port 402 is also configured to attach a second cable to the port 402 using a connector. Such a cable is also referred to here as a "connectorized" cable or "patch cord". The port 402 includes a suitable connector, adapter, or jack that mates with the corresponding connector on the end of the patch cord. The connector is used to facilitate the easy and repeated attachment and unattachment of the connectorized media segment to the port 402. Examples of connectorized cables include CAT-5, 6, and 7 twisted-pair cables having modular connectors or plugs attached to both ends (in which case, the patch cords 402 include compatible modular jacks) or fiber cables having SC, LC, FC, LX.5, MTP, or MPO connectors (in which case, the patch cords 402 include compatible SC, LC, FC, LX.5, MTP, or MPO connectors or adapters). The techniques described here can be used with other types of connectors including, for example, BNC connectors, F connectors, DSX jacks and plugs, bantam jacks and plugs, and MPO and MTP multi-fiber connectors and adapters.

Each port 402 communicatively couples the respective fixed cable to the respective connector of any patch cord inserted into that port 402. In one implementation, each port 402 is designed for use with a fixed cable and a patch cord that comprise the same type of physical communication media, in which case each port 402 communicatively couples the fixed cable to the patch cord at the physical layer level without any media conversion. In other implementations, each port 402 communicatively couples the fixed cable to the patch cord in other ways (for example, using a media converter if the fixed cable and the patch cord comprise different types of physical communication media).

Each port 402 has associated with it a respective switch 404. Each switch 404 is configured to be in a first state when a patch cord connector attached to a patch cord is not inserted in that port 402 and to be in a second state when a patch cord connector is inserted in that port 402. In one implementation of such an example, an electromechanical switch is used where, when no patch cord connector is inserted into the corresponding port 402, the switch is in a first (open) state and, when a patch cord connector is inserted into the corresponding port 402, the switch is in a second (closed) state. In another implementation, an infrared non-contact switch is used in which an infrared emitting diode produces an infrared beam that is detected by a corresponding infrared detector. In such an implementation, when no patch cord connector is inserted into the corresponding port 402, the infrared detector is able to detect the infrared beam and the switch is considered to be in a first state. When a patch cord connector is inserted into the corresponding port 402, the infrared detector is not able to detect the infrared beam because the connector blocks the infrared beam and prevents it from reaching the infrared detector, in which case the switch is considered to be in a second state. In other implementations and embodiments, other types of switches are used. Examples of suitable switches 404 are described in the '208 application and the '961 application.

A programmable processor 406 is mounted to the patch panel 400. The programmable processor 406 executes software 408 for, among other things, monitoring the state of the switches 404 for the patch panel 400. The software 408 comprises program instructions that are stored (or otherwise embodied) on or in an appropriate non-transitory storage medium or media 410 (such as flash or other non-volatile memory, magnetic disc drives, and/or optical disc drives) from which at least a portion of the program instructions are read by the programmable processor 406 for execution thereby. The storage medium 410 on or in which the program instructions are embodied is also referred to here as a "program product". Although the storage medium 410 is shown in FIG. 4 as being included in, and local to, the patch panel 400, it is to be understood that removable media and/or remote storage media (for example, storage media that is accessible over a network) can also be used. The patch panel 400 also includes memory 412 for storing the program instructions (and any related data) during execution by the programmable processor 406. Memory 412 comprises, in one implementation, any suitable form of random access memory (RAM) now known or later developed, such as dynamic random access memory (DRAM). In other embodiments, other types of memory are used.

In the particular embodiment shown in FIG. 4, the patch panel 400 includes four digital-to-analog converters (DAC) 414. Each DAC 414 functions in the same manner as DAC 112 described above in connection FIG. 1. Each DAC 414 converts a binary code presented on its inputs 416 into an analog signal that is proportional to the binary code. That is, the inputs 416 of each DAC 414 correspond to the binary digits of the binary code that is presented to that DAC 414. The analog signal is presented on the output 418 of that DAC 414. In the embodiment shown in FIG. 4, the patch panel 400 includes 24 ports 402 and a 24 switches 404. In this embodiment, six of the inputs of each DAC 414 (the inputs corresponding the six most significant binary digits) are coupled to six of the switches 404.

The output 418 of each DAC 414 is connected to the input of a separate unity gain buffer amplifier 420. In the particular embodiment shown in FIG. 4, the programmable processor 406 includes an analog-to-digital converter 422 that has a separate channel 424 for each of the eight DACs 414. In other words, the ADC 422 in the programmable processor 410 has at least four ADC channels 424. The ADC 422, for each of the four ADC channels 424, converts the analog output received on that channel 424 back to a binary code that is proportional to the received analog output. The binary code that is output by the ADC 422 for each ADC channel 424 is a digital representation of the state of the switches 404 that are connected to the DAC 414 that produced the analog output signal. In the particular embodiment shown in FIG. 4, the programmable processor 406 includes the ADC 422, though in other embodiments an external ADC can be used. The programmable processor 406 includes a separate register 426 for each ADC channel 424. The ADC 422 periodically updates the contents of the associated register 430 with the binary code output by the ADC 422 for that ADC channel 424.

In one example, a patch cord being inserted into a port 402 causes the corresponding switch 404 to enter a state that is associated with a logical "1" and a patch cord being removed from a port 402 causes the corresponding switch 404 to enter a state that is associated with a logical "0". If the same type of DAC shown in FIG. 1 is used and there are patch cords inserted into ports 402 associated with the two most significant bits and the third least significant bit of one of the DACs 413 with the two least significant bits tied to ground for improved noise immunity and no patch cords inserted into the ports 402 associated with the other bits of that DAC 414, a binary code "11000100" would be presented on the inputs 416 of that DAC 414. In response, that DAC 414 would output a voltage of 2.555 Volts, which is 1×1.67 Volts+1×833 millivolts+0×416 millivolts+0×208 millivolts+0×104 millivolts+

1×52 millivolts+0×26 millivolts+0×13 millivolts. The ADC 422, upon receiving the analog signal output having that voltage from the DAC 414 would reconstruct the binary code "110000100" from the analog output and place it into the contents of the corresponding register 426.

The software 408 executing on the programmable processor 406 monitors the state of the plurality of switches 404 by monitoring the contents of the registers 426. As a result, the software 408 need not scan the individual switches 404 in order to monitor state of the switches 404. For example, the programmable processor 406 can be implemented using an 8-bit central processing unit (CPU) having an ADC that takes about 20 microseconds to produce a digital output for a given analog channel. This is considerably faster than the time that would typically be required to scan each of the switches 404 using a conventional I/O expander/addressing scheme.

In the particular embodiment shown in FIG. 4, at least some of the patch cords include a storage device in which identity and attribute information for that patch cord is stored. Examples of storage devices include an Electrically Erasable Programmable Read-Only Memory (EEPROM) or other non-volatile memory device. In such an embodiment, each of the port 402 has a respective media reading interface 428 via which the programmable processor 406 is able to read any identifier and attribute information stored in or on any patch cord that is inserted into that port 402. The programmable processor 406 is communicatively coupled to each of the media reading interfaces 428 using a suitable bus or other interconnect (not shown). Additional details regarding such an embodiment can be found in the '624 application.

When a patch cord is inserted into a port 402, the insertion causes the switch 404 associated with that port 402 to be actuated (or otherwise switched) and changed from the state associated with no patch cord being inserted in the port 402 (for example, a logical "0") to the state associated with a patch cord being inserted in the port 402 (for example, a logical "1"). The programmable processor 406 monitors the registers 426 to determine when a patch cord has been inserted into a port 402 and when it detects that the state of given switch 404 has changed from the state associated with no patch cord being inserted in the port 402 to the state associated with a patch cord being inserted in the port 402, the programmable processor 406 reads the identifier and attribute information stored in or on the patch cord that was inserted into that port 402 using the appropriate media reading interface 428.

Figure 5:
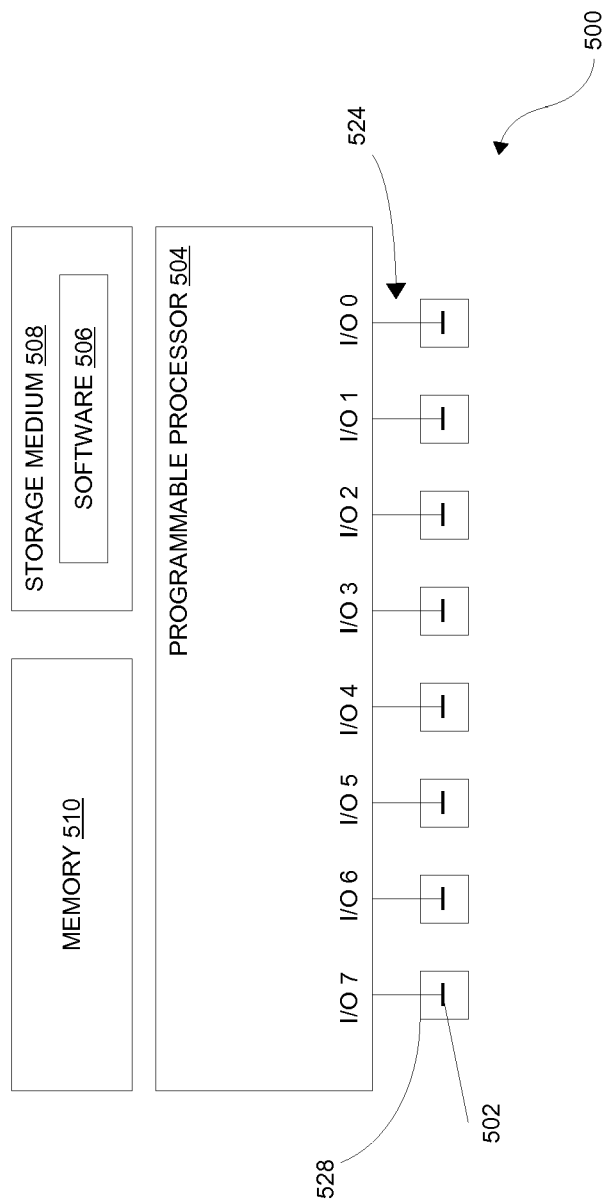
FIG. 5 is a block diagram of another embodiment of a system that is configured to monitor the state of a plurality of switches.

FIG. 5 is a block diagram of another embodiment of a system 500 that is configured to monitor the state of a plurality of switches 502. In the system 500 shown in FIG. 5, a programmable processor 504 executes software 506 for, among other things, monitoring the state of the plurality of switches 502. The software 506 comprises program instructions that are stored (or otherwise embodied) on or in an appropriate non-transitory storage medium or media 508 (such as flash or other non-volatile memory, magnetic disc drives, and/or optical disc drives) from which at least a portion of the program instructions are read by the programmable processor 504 for execution thereby. The storage medium 508 on or in which the program instructions are embodied is also referred to here as a "program product". Although the storage medium 508 is shown in FIG. 5 as being included in, and local to, the system 500, it is to be understood that removable media and/or remote storage media (for example, storage media that is accessible over a network) can also be used.

The system 500 also includes memory 510 for storing the program instructions (and any related data) during execution by the programmable processor 504. Memory 510 comprises, in one implementation, any suitable form of random access memory (RAM) now known or later developed, such as dynamic random access memory (DRAM). In other embodiments, other types of memory are used.

The processor 504 comprises a plurality of input/output (I/O) lines 524. For example, in one implementation of such an embodiment, the I/O lines 524 comprise a plurality of serial communication I/O lines that can be individually read by the processor 504. Each of the switches 502 is coupled to a respective I/O line 524. In the embodiment shown in FIG. 5, the I/O lines 524 are a part of a register set that can be read from or written to simultaneously.

In the embodiment shown in FIG. 5, the system 500 includes a separate circuit 528 for each switch 502 that is configured to develop a first logic state on the input/output line 524 associated with that switch 502 when that switch 502 is in a first switch state (for example, when the switch 502 is in a closed state) and to develop a second logic state on the input/output line 524 associated with that switch 502 when that switch 502 is in a second switch state (for example, when the switch 502 is in an open state). The software 506 executing on the processor 504 monitors the state of the plurality of switches 502 by reading the I/O lines 524 as a register. In this way, the software 506 need not scan the individual switches 502 (nor the individual I/O lines 524) in order to monitor the state of the switches 502.

Also, the circuit 528 for each switch 502 is configured to enable data other than the state of the switch 502 to be communicated over the input/output lines 524. In this way, the same input/output lines 524 can be used both to detect the status of the switch 502 and to communicate other data, thereby reducing the number of overall input/output lines needed to carry out both functions. For example, in one implementation of such an embodiment, each input/output line 524 is used to read from and/or write to a memory device (such as a UNI/O electrically erasable programmable read only memory (EEPROM) device).

Figure 6:
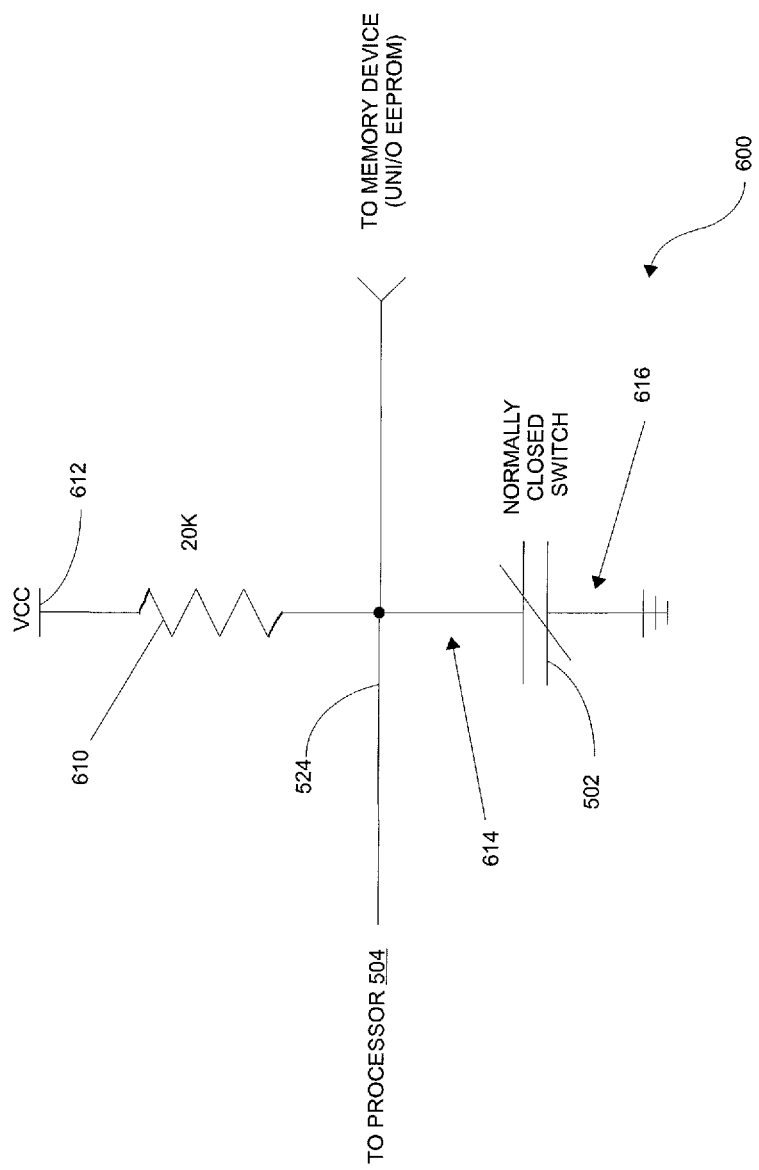
FIGS. 6 and 7 are block diagrams of exemplary embodiments of a circuits that can be used to couple one of the switches to the processor in the system of FIG. 5.

FIG. 6 is a block diagram of an exemplary embodiment of a circuit 600 that can be used to couple one of the switches 502 to the processor 504 in the system 500 of FIG. 5. The exemplary circuit 600 shown in FIG. 6 is designed for use where each switch 502 is implemented using a normally closed switch. In the exemplary embodiment shown in FIG. 6, a pull-up resistor 610 is coupled to a supply voltage 612 and to a first terminal 614 of the normally closed switch 502. A second terminal 616 of the normally closed switch 502 is coupled to ground. The input/output line 524 for that switch 502 is also coupled to the first terminal 614 of the normally closed switch 502.

When the normally closed switch 502 is closed, the first terminal 614 is coupled to ground, which causes an idle logic low state to be developed on the input/output line 524.

When the normally closed switch 502 is opened, the first terminal 614 is coupled to the supply voltage 612 via the pull-up resistor 610, which causes an idle logic high state to be developed on the input/output line 524.

The circuit 600 is also configured to enable data other than the state of the switch 502 to be communicated over the input/output line 524 when the switch 502 is opened. For example, a memory device (such as a UNI/O EEPROM) can be coupled to the input/output line 524 and the data stored in the memory device can be read. Due to the configuration of the circuit 600, the memory device coupled to the input/output line 524 can still pull the input/output line 524 to ground in order to output a logic low. In one exemplary implementation of the embodiment shown in FIG. 6, the pull-up resistor 610 is implemented using a 20 k Ohm resistor.

Figure 7:
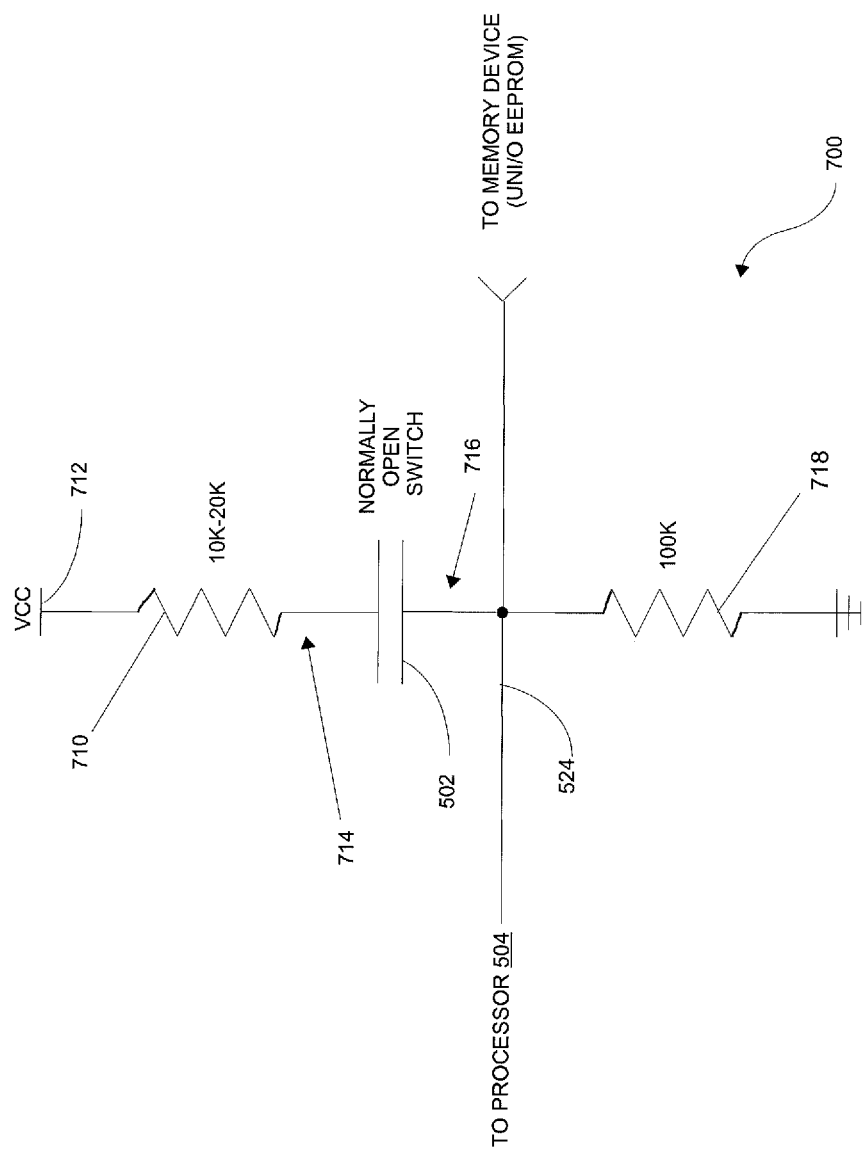

FIG. 7 is a block diagram of an exemplary embodiment of a circuit 700 that can be used to couple one of the switches 502 to the processor 504 in the system 500 of FIG. 5. The exemplary circuit 700 shown in FIG. 7 is designed for use where each switch 502 is implemented using a normally open switch. In the exemplary embodiment shown in FIG. 7, a pull-up resistor 710 is coupled to a supply voltage 712 and to a first terminal 714 of the normally open switch 502. A second terminal 716 of the normally open switch 502 is coupled to ground via a weak pull-down resistor 718. The input/output line 524 for that switch 502 is also coupled to the second terminal 716 of the normally open switch 502.

When the normally open switch 502 is open, the second terminal 716 is coupled to ground via the weak pull-down resistor 718, which causes an idle logic low state to be developed on the input/output line 524.

When the normally open switch 502 is closed, the first terminal 714 is coupled to the supply voltage 712 via the pull-up resistor 710, which causes an idle logic high state to be developed on the input/output line 524.

The circuit 700 is also configured to enable data other than the state of the switch 502 to be communicated over the input/output line 524 when the switch 502 is closed. For example, a memory device (such as a UNI/O EEPROM) can be coupled to the input/output line 524 and the data stored in the memory device can be read. Due to the configuration of the circuit 700, the memory device coupled to the input/output line 524 can still pull the input/output line 524 to ground in order to output a logic low since the pull-down resistor 718 is implemented using a "weak" pull-down resistor. In one exemplary implementation of the embodiment shown in FIG. 7, the pull-up resistor 710 is implemented using a 10 k-20 k Ohm resistor, and the weak pull-down resistor 712 is implemented using a 100 k Ohm resistor.

Figure 8:
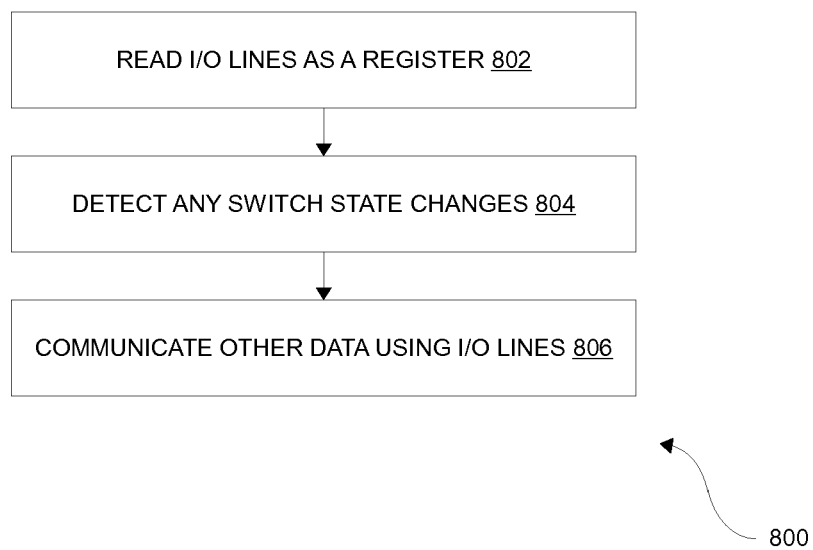
FIG. 8 is a flow diagram of one embodiment of a method of monitoring the state of a plurality of switches.

FIG. 8 is a flow diagram of one embodiment of a method 800 of monitoring the state of a plurality of switches. The embodiment of method 800 shown in FIG. 8 is described here as being implemented in the system 500 of FIG. 5 in order to aggregate state information for the plurality of switches 502, though other embodiments can be implemented in other ways.

As noted above, the logic state that is presented on each input/output line 524 associated with each of the switches 502 reflects the state of that switch 502.

Method 800 comprises reading the I/O lines 524 as a register (block 802). For example, the software 506 executing on the processor 504 reads the I/O lines 524 as a register (that is, reads the I/O lines 524 simultaneously or in parallel). In this embodiment, the I/O lines 524 are periodically read.

Method 800 further comprises detecting any change in the state of any of the switches 502 (block 804). This can be done by comparing success values read from the I/O lines 524.

For example, if the respective switches 502 that are associated with associated with I/O line 7, I/O line 6, and I/O line 2 are closed while the switches 502 associated with the other I/O lines 524 are open, a logic high value would be developed on I/O line 7, I/O line 6, and I/O line 2 and a logic low value would be developed on I/O line 5, I/O line 4, I/O line 3, I/O line 1, and I/O line 0. As a result, a binary code "11000100" would be presented on the I/O lines 524 and the software 506 would read a value of 11000100 when it reads the I/O lines 524 as a register. If the switch 502 associated with I/O line 5 is closed (with no changes to the other switches 502), a logic high value would also be developed on I/O line 5 and, as a result, a binary code "11100100" would be presented on the I/O lines 524 and the software 506 would read a value of 11100100 when it reads the I/O lines 524 as a register and would be able to detect the change based on the change in the value of the bit associated with I/O line 5.

Method 800 further comprises communicating data other than switch-state data on the I/O lines 524 (block 806). For example, in one implementation of such an embodiment, the software 506 uses each input/output line 524 to read from and/or write to a memory device (such as a UNI/O electrically erasable programmable read only memory (EEPROM) device). Such reading can occur upon a change in the state of one of the switches 502.

Figure 9:
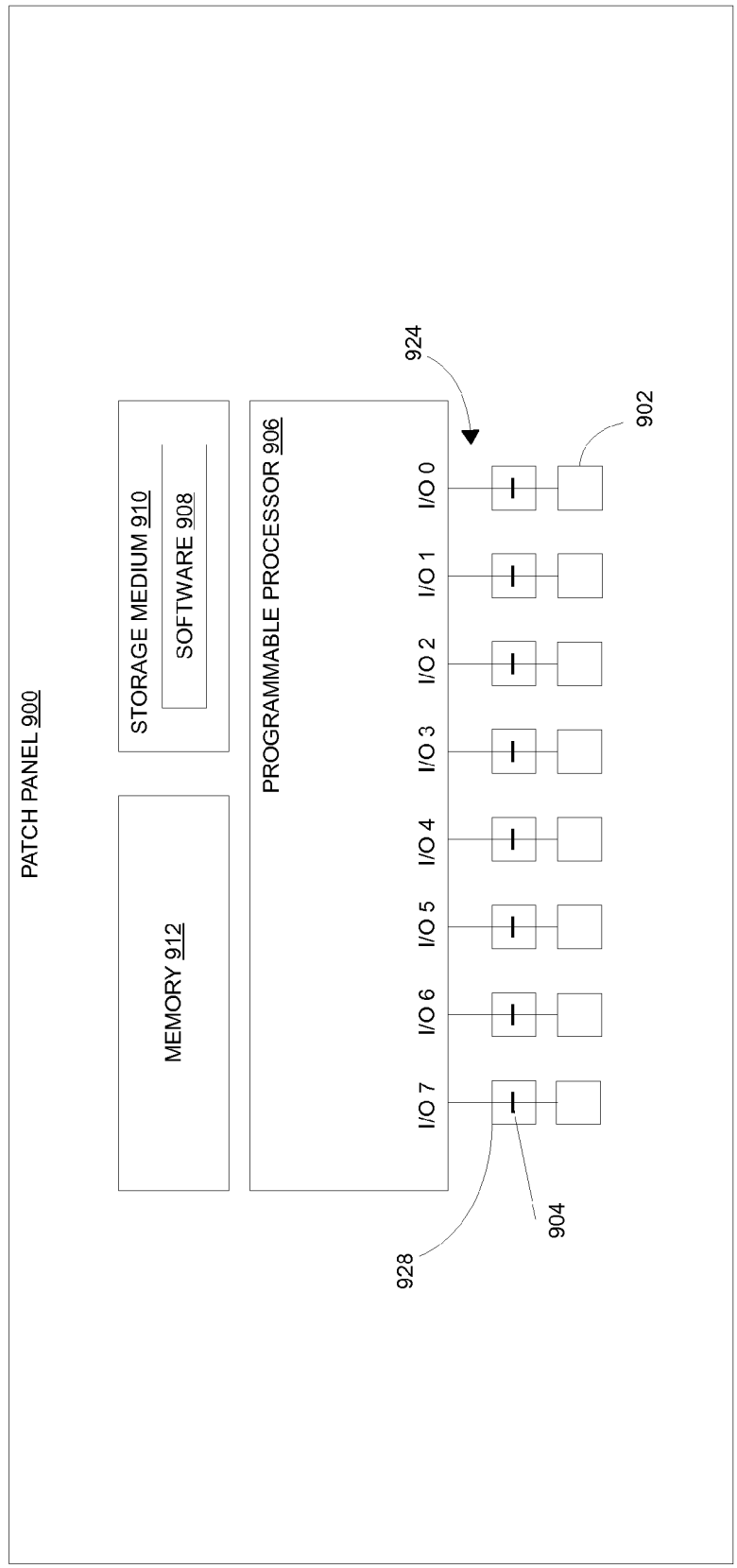
FIG. 9 is a block diagram of one embodiment of a patch panel that uses the switch-state aggregation techniques described above in connection with FIGS. 5-8.

FIG. 9 is a block diagram of one embodiment of a patch panel 900 that uses the switch-state aggregation techniques described above in connection with FIGS. 5-8. Except as described below, the patch panel 900 is similar to the patch panel 400 described above in connection with FIG. 4.

The patch panel 900 comprises a plurality of ports 902. Each port 902 is configured to attach a first cable (or other segment of communication media) to the port 902 in a semi-permanent manner. Each port 902 is also configured to attach a "connectorized" cable or "patch cord" to the port 902 using a connector. The port 902 includes a suitable connector, adapter, or jack that mates with the corresponding connector on the end of the patch cord. The connector is used to facilitate the easy and repeated attachment and unattachment of the connectorized media segment to the port 902. In the particular example shown in FIG. 9, the patch panel 900 comprises eight ports 902.

Each port 902 communicatively couples the respective fixed cable to the respective connector of any patch cord inserted into that port 902. In one implementation, each port 902 is designed for use with a fixed cable and a patch cord that comprise the same type of physical communication media, in which case each port 902 communicatively couples the fixed cable to the patch cord at the physical layer level without any media conversion. In other implementations, each port 902 communicatively couples the fixed cable to the patch cord in other ways (for example, using a media converter if the fixed cable and the patch cord comprise different types of physical communication media).

Each port 902 has associated with it a respective switch 904. Each switch 904 is configured to be in a first state when a patch cord connector attached to a patch cord is not inserted in that port 902 and to be in a second state when a patch cord connector is inserted in that port 902. Examples of suitable switches 904 are described in the '208 Application and the '961 Application.

A programmable processor 906 is mounted to the patch panel 900. The programmable processor 906 executes software 908 for, among other things, monitoring the state of the switches 904 for the patch panel 900. The software 908 comprises program instructions that are stored (or otherwise embodied) on or in an appropriate non-transitory storage medium or media 910 from which at least a portion of the program instructions are read by the programmable processor 906 for execution thereby. The storage medium 910 on or in which the program instructions are embodied is also referred to here as a "program product". The patch panel 900 also includes memory 912 for storing the program instructions (and any related data) during execution by the programmable processor 906.

In the particular embodiment shown in FIG. 9, the processor 906 comprises eight input/output (I/O) lines 924 (also individually labeled I/O line 0 through I/O line 7 in FIG. 9). Each of the switches 904 is coupled to a respective I/O line 924. In the embodiment shown in FIG. 9, the I/O lines 924 are a part of a register set that can be read from or written to simultaneously.

In the embodiment shown in FIG. 9, the system 900 includes a separate circuit 928 for each switch 904 that is configured to develop a first logic state on the input/output line 924 associated with that switch 904 when that switch 904 is in a first switch state (for example, when the switch 904 is a closed state) and to develop a second logic state on the input/output line 924 associated with that switch 904 when that switch 904 is in a second switch state (for example, when the switch 904 is in an open state). The software 906 executing on the processor 906 monitors the state of the plurality of switches 904 by reading the I/O lines 924 as a register. In this way, the software 906 need not scan the individual switches 904 (nor the individual I/O lines 924) in order to monitor the state of the switches 904.

In one exemplary implementation, the software 908 is configured to poll the I/O lines 924 by periodically reading the I/O lines 924 as a register. In one example, a patch cord being inserted into a port 902 causes the corresponding switch 904 to enter a state that is associated with a logical "1" and a patch cord being removed from a port 902 causes the corresponding switch 904 to enter a state that is associated with a logical "0". For example, if there are patch cords inserted into the ports 902 associated with I/O line 7, I/O line 6, and I/O line 2, logic high value would be developed on I/O line 7, I/O line 6, and I/O line 2 and a logic low value would be developed on I/O line 5, I/O line 4, I/O line 3, I/O line 1, and I/O line 0. As a result, a binary code "11000100" would be presented on the I/O lines 924 and the software 908 would read a value of 11000100 when it reads the I/O lines 924 as a register. If a patch cord is then later inserted into the port 902 associated with I/O line 5 (with no changes to the other ports 902), a logic high value would also be developed on I/O line 5 and, as a result, a binary code "11100100" would be presented on the I/O lines and the software 908 would read a value of 11100100 when it reads the I/O lines 924 as a register and would be able to detect the change.

In the particular embodiment shown in FIG. 9, at least some of the patch cords include a storage device in which identity and attribute information for that patch cord is stored. In the particular embodiment shown in FIG. 9, the techniques described above in connection with FIGS. 5-7 are used to read the contents of the storage device over the same I/O line 924 that is used to detect the presence of the patch cord. For example, the storage device can be implemented using a UNI/O EEPROM, wherein the I/O line 924 is coupled to the UNI/O bus of the EEPROM.

When a patch cord is inserted into a port 902, the insertion causes the switch 904 associated with that port 902 to be actuated (or otherwise switched) and changed from the state associated with no patch cord being inserted in the port 902 (for example, a logical "0") to the state associated with a patch cord being inserted in the port 902 (for example, a logical "1"). The programmable processor 906 monitors the I/O lines 924 to determine when a patch cord has been inserted into a port 902 and when it detects that the state of given switch 904 has changed from the state associated with no patch cord being inserted in the port 902 to the state associated with a patch cord being inserted in the port 902, the programmable processor 906 reads the identifier and attribute information stored in or on the patch cord that was inserted into that port 902 using the I/O line 924 associated with that port 902.

In the embodiments shown above in connection with FIG. 5-9, each of the switches and circuits is directly coupled to a respective one of the I/O lines of the processors. However, in other embodiments (for example, where the number of switches to be monitored exceeds the number of available I/O lines) one or more multiplexing devices are used to indirectly couple the monitored switches to the I/O lines of the processor. One such exemplary embodiment is shown in FIG. 10.

Figure 10:
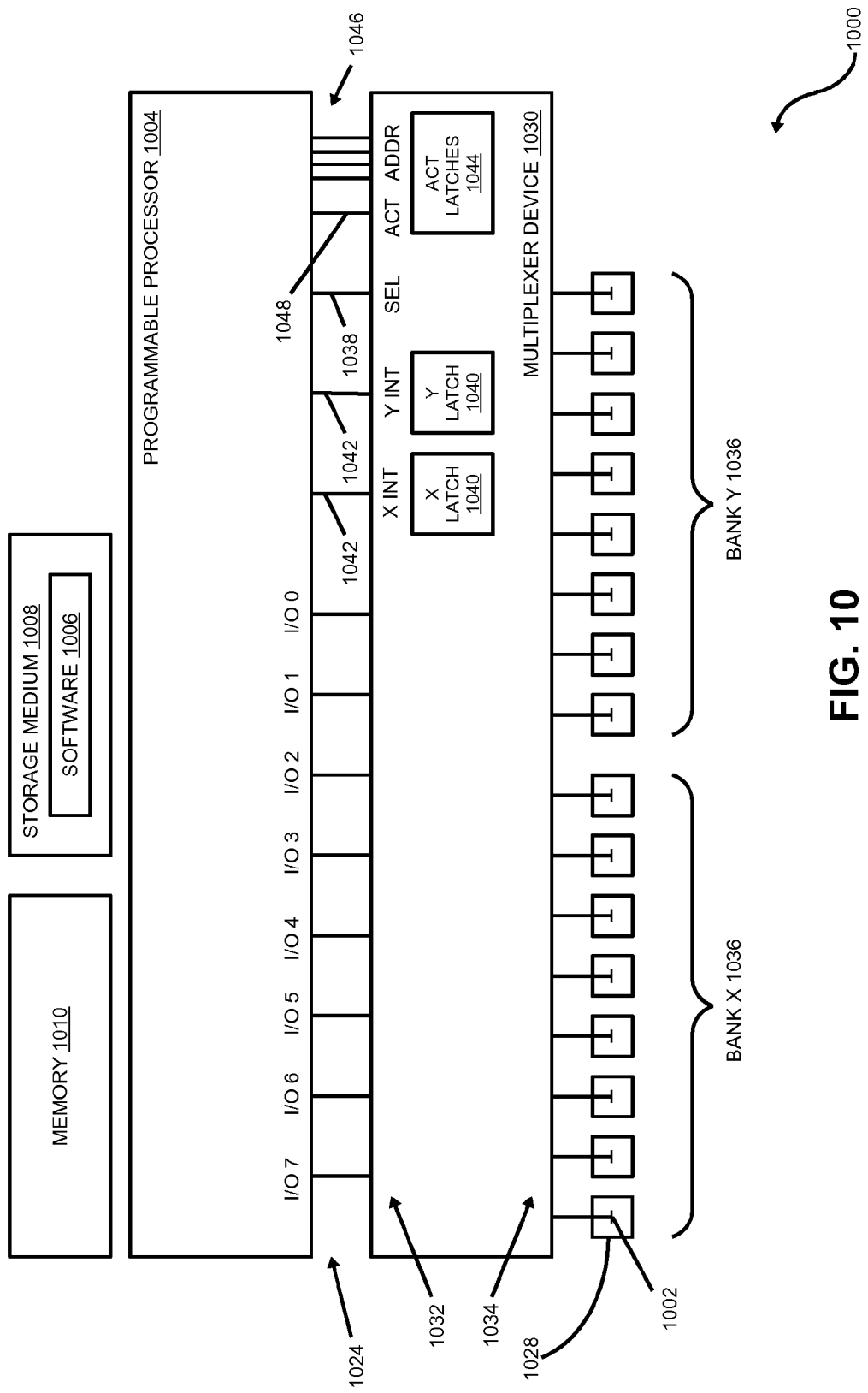
FIG. 10 is a block diagram of another embodiment of a system that is configured to monitor the state of a plurality of switches.

FIG. 10 is a block diagram of an exemplary embodiment of a system 1000 that is configured to monitor the state of a plurality of switches 1002. The exemplary system 1000 shown in FIG. 10 is similar to the exemplary system 500 shown in FIG. 5.

In the system 1000 shown in FIG. 10, a programmable processor 1004 executes software 1006 for, among other things, monitoring the state of each switch 1002. The software 1006 comprises program instructions that are stored (or otherwise embodied) on or in an appropriate non-transitory storage medium or media 1008 (such as flash or other non-volatile memory, magnetic disc drives, and/or optical disc drives) from which at least a portion of the program instructions are read by the programmable processor 1004 for execution thereby. The storage medium 1008 on or in which the program instructions are embodied is also referred to here as a "program product". Although the storage medium 1008 is shown in FIG. 10 as being included in, and local to, the system 1000, it is to be understood that removable media and/or remote storage media (for example, storage media that is accessible over a network) can also be used.

The system 1000 also includes memory 1010 for storing the program instructions (and any related data) during execution by the programmable processor 1004. Memory 1010 comprises, in one implementation, any suitable form of random access memory (RAM) now known or later developed, such as dynamic random access memory (DRAM). In other embodiments, other types of memory are used.

In the embodiment shown in FIG. 10, the system 1000 includes a separate circuit 1028 for each switch 1002. Each circuit 1028 is configured to develop a first logic state on the input/output line 1024 associated with the corresponding switch 1002 when that switch 1002 is in a first switch state (for example, when the switch 1002 is in a closed state) and to develop a second logic state on the input/output line 1024 associated with that switch 1002 when that switch 1002 is in a second switch state (for example, when the switch 1002 is in an open state). The software 1006 executing on the processor 1004 monitors the state of the switches 1002 by reading the I/O lines 1024 as a register. In this way, the software 1006 need not scan the individual switches 1002 (nor the individual I/O lines 1024) in order to monitor the state of the switches 1002. As noted below, in this particular embodiment, the software 1006 executing on the processor 1004 is configured to read the state of a subset of the switches 1002 by reading the I/O lines 1024 of the processor 1004 as a register.

Also, the circuit 1028 for each switch 1002 is configured to enable data other than the state of the switch 1002 to be communicated over the input/output lines 1024. In this way, the same input/output lines 1024 can be used both to detect the status of the switch 1002 and to communicate other data, thereby reducing the number of overall input/output lines needed to carry out both functions. For example, in one implementation of such an embodiment, each input/output line 1024 is used to read from and/or write to a memory device (such as a UNI/O electrically erasable programmable read only memory (EEPROM) device).

In the system 1000 shown in FIG. 10, the number of switches 1002 that are monitored by the software 1006 executing on the programmable processor 1004 exceeds the number of I/O lines 1024 that are available in the processor 1004 for that purpose. More specifically, in the particular example shown in FIG. 10, the processor 1004 is configured to monitor sixteen switches 1002 but only eight I/O lines are available for that purpose. A multiplexer device 1030 is used to couple the sixteen switches 1002 to the eight I/O lines 1024 of the processor 1004. In one exemplary implementation of such an embodiment, the multiplexer device 1030 is implemented using a programmable device (such as an expanded programmable logic device (XPLD)). The particular number of switches 1002 and I/O lines 1024 used in this embodiment are merely exemplary and other numbers of switches 1002 and I/O lines 1024 can be used.

The multiplexer device 1030 has eight I/O lines 1032, each of which is connected to a respective one of the eight I/O lines 1024 of the processor 1004. These I/O lines 1032 are also referred to here as the "processor I/O lines" 1032. Also, the multiplexer device 1030 has sixteen I/O lines 1034, each of which is connected to a respective one of the sixteen circuits 1028 that are used for monitoring the state of the switches 1002. These I/O lines 1034 are also referred to here as the "switch I/O" lines 1034.

In the particular embodiment shown in FIG. 10, the sixteen switch I/O lines 1034 are arranged into two logical banks 1036 of eight switch I/O lines 1034 each. One of the banks 1036 is referred to here as "bank X", and the other bank 1036 is referred to here as "bank Y".

The multiplexer device 1030 also includes a select (SEL) line 1038 that is coupled to the processor 1004. The multiplexer device 1030 is configured so that it couples one of the logical banks 1036 of eight switch I/O lines 1034 to the eight processor I/O lines 1032 based on the state of the SEL line 1038. For example, if the processor 1004 establishes a first logical value on the SEL line 1038 (for example, a logical "0"), the multiplexer device 1030 couples each of the eight switch I/O lines 1034 in logical bank X to a respective one of the eight processor I/O lines 1032. If the processor 1004 establishes a second logical value on the SEL line 1038 (for example, a logical "1"), the multiplexer device 1030 couples each of the eight switch I/O lines 1034 in logical bank Y to a respective one of the eight processor I/O lines 1032. In this way, the processor 1004 is able to monitor the sixteen switches 1002 and sixteen circuits 1028 using only the eight I/O lines 1024 that are available in the processor 1004 for that purpose.

In the exemplary embodiment shown in FIG. 10, the multiplexer device 1030 is further configured to latch changes in the state of the switches 1002. This is done so that the processor 1004 need not constantly switch between bank X and bank Y in connection with detecting changes in the state of the switches 1002. Instead, the multiplexer device 1030 is configured so that each bank 1036 has an associated latch 1040 that is set whenever a switch 1002 included in that bank 1036 has a change of state. Each latch can be implemented in the conventional manner using any suitable device (for example, a memory location or a flip-flop). The multiplexer device 1030 includes a separate line 1042 for each latch 1040 that the processor 1004 can use to read the state of that latch 1040. The latch 1040 associated with bank X is also referred to here as "latch X", and the latch 1040 associated with bank Y is also referred to here as "latch Y". Also, the line 1042 associated with bank X is also referred to here as the "X INT line", and the line 1042 associated with bank Y is also referred to here as the "Y INT line".

For example, when the state of a switch 1002 included in bank X changes, latch X is set. The processor 1004 will then detect that the state of latch X has changed. Then, the processor 1004 sets the state of the SEL line 1038 in order to select logical bank X and reads the states of the I/O lines 1024 as a register. The processor 1004 then compares the current state of the I/O lines 1024 for bank X to the state of the I/O lines 1024 for bank X when last read. This is done in order to determine which switch 1002 has had a state change. Then, the processor 1004 is able to take an action that is appropriate for the particular state change as described above in connection with the embodiments of FIGS. 5-9. The multiplexer device 1030 includes appropriate additional lines to assist in carrying out such operations. For example, in one implementation of such an embodiment where each input/output line 1024 is used to both read from and write to a memory device (such as a UNI/O EEPROM device), the multiplexer device 1030 would implement a bi-directional multiplexer for each processor I/O line 1032. That is, the multiplexer device 1030, in such an implementation, implements a discrete a transmit (write) and receive (read) channel for each processor I/O line 1032 that it multiplexes between two respective switch I/O lines 1034. In such an embodiment, the multiplexer device 1030 implements one or more read/write (RW) lines to indicate whether a read or write operation is to be performed for the processor I/O lines 1032.

The multiplexer device 1030 is configured so that each latch 1040 is reset when the SEL line 1038 is used to select the bank 1036 that is associated with that latch 1040. Moreover, the multiplexer device 1030 is configured to inhibit the latching of each latch 1040 while the bank 1036 that is associated with that latch 1040 is selected by the SEL line 1038.

It is possible that after the state of a switch 1002 changes to a first state, the switch 1002 can change back to the second state before the processor 1004 is able to read the state of the switches 1002 in that bank 1036. When such a pair of rapid state changes occur, the processor 1004 may not be able to determine which switch 1002 has had a state change based on comparing the current state of the I/O lines 1024 for that bank 1036 to the state of the I/O lines 1024 for that bank 1036 when last read. In the particular embodiment shown in FIG. 10, the multiplexer device 1030 is configured so that each switch I/O line 1034 has a corresponding latch 1044 that is set whenever such a pair of rapid state changes occur (that is, the state of the corresponding switch 1002 changes to a first state and then changes back to a second state before the processor 1004 is able to select the corresponding bank 1036 and read the state of the switches 1002 in that bank 1036). These latches 1044 are also referred to here as the "ACT latches" 1044. As a result, when the processor 1004 detects that one of the X or Y latches 1040 has been set, the processor 1004 selects the associated bank 1036 using the SEL line 1038, reads the states of the switches 1002 in the selected bank 1036, and determines that there is no difference between the current state of the switches 1002 for the selected bank 1036 and the previous state for the selected bank 1036, the processor 1004 checks the state of each ACT latch 1044 to determine which switches 1002 have had a pair of rapid state changes.

In the exemplary embodiment shown in FIG. 10, the multiplexer device 1030 implements a set of address (ADDR) lines 1046 that the processor 1004 can use to address a particular ACT latch 1044. The multiplexer device 1030 also implements a line 1048 (also referred to here as the "ACT line") on which the multiplexer device 1030 outputs the state of the ACT latch 1044 that is currently addressed using the ADDR lines 1046. In this way, the processor 1004 can check the state of each ACT latch 1044 to determine which switches 1002 have had a pair of rapid state changes since the last time the state of the switches 1002 for that bank 1036 was read.

The system 1000 shown in FIG. 10 (including the multiplexing device 1030) can be used in a patch panel of the type shown in FIG. 9.

Also, in other embodiments, one or more multiplexing devices are used to indirectly couple the monitored switches to the I/O lines of the processor, where the multiplexing devices are not configured with the latch features described above in connection with FIG. 10 (for example, where the processor is instead configured to constantly switch between the various banks of switches in order to detect when state changes occur in the switches).

The switch-state aggregation techniques described here can be used in other embodiments. For example, the switch-state aggregation techniques described here be used in other embodiments can also be used in the managed connectivity systems described in the applications referenced in the first paragraph of this application.

Further details, embodiments, and implementations can be found in the following United States patent applications, all of which are hereby incorporated herein by reference: U.S. Provisional Patent Application Ser. No. 61/252,964, filed on Oct. 19, 2009, titled "ELECTRICAL PLUG FOR MANAGED CONNECTIVITY", U.S. Provisional Patent Application Ser. No. 61/253,208, filed on Oct. 20, 2009, titled "ELECTRICAL PLUG FOR MANAGED CONNECTIVITY", U.S. patent application Ser. No. 12/907,724, filed on Oct. 19, 2010, titled "MANAGED ELECTRICAL CONNECTIVITY SYSTEMS", U.S. Provisional Patent Application Ser. No. 61/303,948, filed on Feb. 12, 2010, titled "PANEL INCLUDING BLADE FEATURE FOR MANAGED CONNECTIVITY", U.S. Provisional Patent Application Ser. No. 61/413,844, filed on Nov. 15, 2010, titled "COMMUNICATIONS BLADED PANEL SYSTEMS", U.S. Provisional Patent Application Ser. No. 61/439,693, filed on Feb. 4, 2011, titled "COMMUNICATIONS BLADED PANEL SYSTEMS", U.S. patent application Ser. No. 13/025,730, filed on Feb. 11, 2011, titled "COMMUNICATIONS BLADED PANEL SYSTEMS", U.S. patent application Ser. No. 13/025,737, filed on Feb. 11, 2011, titled "COMMUNICATIONS BLADED PANEL SYSTEMS", U.S. patent application Ser. No. 13/025,743, filed on Feb. 11, 2011, titled "COMMUNICATIONS BLADED PANEL SYSTEMS", U.S. patent application Ser. No. 13/025,750, filed on Feb. 11, 2011, titled "COMMUNICATIONS BLADED PANEL SYSTEMS", U.S. Provisional Patent Application Ser. No. 61/303,961; filed on Feb. 12, 2010, titled "Fiber Plug And Adapter For Managed Connectivity", U.S. Provisional Patent Application Ser. No. 61/413,828, filed on Nov. 15, 2010, titled "Fiber Plugs And Adapters For Managed Connectivity", U.S. Provisional Patent Application Ser. No. 61/437,504, filed on Jan. 28, 2011, titled "Fiber Plugs And Adapters For Managed Connectivity", U.S. patent application Ser. No. 13/025,784, filed on Feb. 11, 2011, titled "Managed Fiber Connectivity Systems", U.S. patent application Ser. No. 13/025,788, filed on Feb. 11, 2011, titled "Managed Fiber Connectivity Systems", U.S. patent application Ser. No. 13/025,797, filed on Feb. 11, 2011, titled "Managed Fiber Connectivity Systems", U.S. patent application Ser. No. 13/025,841, filed on Feb. 11, 2011, titled "Managed Fiber Connectivity Systems", U.S. Provisional Patent Application Ser. No. 61/413,856, filed on Nov. 15, 2010, titled "CABLE MANAGEMENT IN RACK SYSTEMS", U.S. Provisional Patent Application Ser. No. 61/466,696, filed on Mar. 23, 2011, titled "CABLE MANAGEMENT IN RACK SYSTEMS", U.S. Provisional Patent Application Ser. No. 61/252,395, filed on Oct. 16, 2009, titled "MANAGED CONNECTIVITY IN ELECTRICAL SYSTEMS", U.S. patent application Ser. No. 12/905,689, filed on Oct. 15, 2010, titled "MANAGED CONNECTIVITY IN ELECTRICAL SYSTEMS", U.S. Provisional Patent Application Ser. No. 61/252,386, filed on Oct. 16, 2009, titled "MANAGED CONNECTIVITY IN FIBER OPTIC SYSTEMS", U.S. patent application Ser. No. 12/905,658, filed on Oct. 15, 2010, titled "MANAGED CONNECTIVITY IN FIBER OPTIC SYSTEMS", U.S. Provisional Patent Application Ser. No. 61/467,715, filed on Mar. 25, 2011, titled "DOUBLE-BUFFER INSERTION COUNT STORED IN A DEVICE ATTACHED TO A PHYSICAL LAYER MEDIUM", U.S. Provisional Patent Application Ser. No. 61/467,725, filed on Mar. 25, 2011, titled "DYNAMICALLY DETECTING A DEFECTIVE CONNECTOR AT A PORT", U.S. Provisional Patent Application Ser. No. 61/467,729, filed on Mar. 25, 2011, titled "IDENTIFIER ENCODING SCHEME FOR USE WITH MULTI-PATH CONNECTORS", U.S. Provisional Patent Application Ser. No. 61/467,736, filed on Mar. 25, 2011, titled "SYSTEMS AND METHODS FOR UTILIZING VARIABLE LENGTH DATA FIELD STORAGE SCHEMES ON PHYSICAL COMMUNICATION MEDIA SEGMENTS", and U.S. Provisional Patent Application Ser. No. 61/467,743, filed on Mar. 25, 2011, titled "EVENT-MONITORING IN A SYSTEM FOR AUTOMATICALLY OBTAINING AND MANAGING PHYSICAL LAYER INFORMATION USING A RELIABLE PACKET-BASED COMMUNICATION PROTOCOL".

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A system comprising:
   a plurality of switches, each having a respective logical binary state; and
   a programmable processor to monitor the state of the plurality of switches, the programmable processor comprising a plurality of input/output lines, wherein each of the plurality of switches is coupled to a respective input/output line;
   wherein for each of the plurality of switches, the system is configured to develop a first logic state on the input/output line associated with that switch when that switch is in a first switch state;
   wherein for each of the plurality of switches, the system is configured to develop a second logic state on the input/output line associated with that switch when that switch is in a second switch state; and
   wherein the system is further configured to enable data other than the first and second switch states to be communicated over the input/output lines.

2. The system of claim 1, further comprising a plurality of circuits, each of the circuits associated with a respective one of the plurality switches and the respective input/output line coupled to that switch;
   wherein each circuit is configured to develop the first logic state on the input/output line of the switch associated with that circuit when that switch is in the first switch state;
   wherein each circuit is configured to develop the second logic state on the input/output line of the switch associated with that circuit when that switch is in the second switch state; and
   wherein each circuit is further configured to enable data other than the first and second switch states to be communicated over the associated input/output line.

3. The system of claim 2, wherein each of the plurality of switches comprises a respective normally closed switch, wherein each circuit comprises a pull-up resistor coupled to a supply voltage and coupled to a first terminal of the normally closed switch, wherein a second terminal of said normally closed switch is coupled to ground, wherein the input/output line associated with that circuit is coupled to the first terminal of said normally closed switch.

4. The system of claim 2, wherein each of the plurality of switches comprises a respective normally open switch, wherein each circuit comprises a pull-up resistor coupled to a supply voltage and a first terminal of the normally open switch, wherein a second terminal of the normally open switch is coupled to a weak pull-down resistor, wherein the weak pull-down resistor is also coupled to ground, wherein the input/output line associated with that circuit is coupled to the first terminal of said normally open switch.

5. The system of claim 1, wherein the programmable processor is configured to monitor the state of the plurality of switches by reading the plurality of input/output lines.

6. The system of claim 1, wherein the programmable processor is configured to communicate data other than the first and second switch states over each of the input/output lines.

7. The system of claim 6, wherein for each of the input/output lines, the programmable processor is configured to read data from a memory device coupled to that input/output line.

8. The system of claim 7, wherein each input/output line is coupled to a UNI/O bus interface of the memory device coupled to that input/output line.

9. The system of claim 1, wherein each input/output line is a general purpose input/output line.

10. The system of claim 1, wherein each of the input/output lines of the programmable processor is coupled to more than one of the plurality of switches.

11. The system of claim 10, wherein each of the input/output lines of the programmable processor is coupled to more than one of the plurality of switches using one or more multiplexing devices.

12. The system of claim 11, wherein the multiplexing device is configured to latch state changes of at least one of the plurality of switches.

13. The system of claim 11, wherein the multiplexing device is configured to determine when a pair of rapid state changes occurs with respect to at least one of the plurality of switches.

14. A patch panel comprising:
a plurality of a ports;
a plurality of switches, each of the plurality of switches being associated with a respective one of the plurality of ports, wherein each of the plurality of switches is configured to be in a first switch state when a cable is inserted into the respective port associated with that switch and in a second switch state when a cable is not inserted into the respective port associated with that switch; and
a programmable processor to monitor the state of the plurality of switches, the programmable processor comprising a plurality of input/output lines, wherein each of the plurality of switches is coupled to a respective input/output line; and
wherein for each of the plurality of switches, the patch panel is configured to develop a first logic state on the input/output line associated with that switch when that switch is in the first switch state;
wherein for each of the plurality of switches, the patch panel is configured to develop a second logic state on the input/output line associated with that switch when that switch is in the second switch state; and
wherein the patch panel is further configured to enable data other than the first and second switch states to be communicated over the input/output lines.

15. The patch panel of claim 14, further comprising a plurality of circuits, each of the circuits associated with a respective one of the plurality switches and the respective input/output line coupled to that switch;
wherein each circuit is configured to develop the first logic state on the input/output line of the switch associated with that circuit when that switch is in the first switch state;
wherein each circuit is configured to develop the second logic state on the input/output line of the switch associated with that circuit when that switch is in the second switch state; and
wherein each circuit is further configured to enable data other than the first and second switch states to be communicated over the associated input/output line.

16. The patch panel of claim 15, wherein each of the plurality of switches comprises a respective normally closed switch, wherein each circuit comprises a pull-up resistor coupled to a supply voltage and coupled to a first terminal of the normally closed switch, wherein a second terminal of said normally closed switch is coupled to ground, wherein the input/output line associated with that circuit is coupled to the first terminal of said normally closed switch.

17. The patch panel of claim 15, wherein each of the plurality of switches comprises a respective normally open switch, wherein each circuit comprises a pull-up resistor coupled to a supply voltage and a first terminal of the normally open switch, wherein a second terminal of the normally open switch is coupled to a weak pull-down resistor, wherein the weak pull-down resistor is also coupled to ground, wherein the input/output line associated with that circuit is coupled to the first terminal of said normally open switch.

18. The patch panel of claim 14, wherein the programmable processor is configured to read information stored on or in a cable that is inserted into the port using the input/output line associated with that port.

19. The patch panel of claim 14, wherein the programmable processor is configured to read information stored on or in a cable that is inserted into the port using the input/output line associated with that port in response to a change in the state of the respective switch associated with that port.

20. The patch panel of claim 14, wherein each cable comprises a copper cable or an optical fiber.

21. The patch panel of claim 14, wherein each cable comprises a copper patch cord or an optical fiber patch cord.

22. The patch panel of claim 14, wherein the programmable processor is configured to monitor the state of the plurality of switches by reading the plurality of input/output lines.

23. The patch panel of claim 14, wherein the programmable processor is configured to communicate data other than the first and second switch states over each of the input/output lines.

24. The patch panel of claim 23, wherein for each of the input/output lines, the programmable processor is configured to read data from a memory device coupled to that input/output line.

25. The patch panel of claim 24, wherein each input/output line is coupled to a UNI/O bus interface of the memory device coupled to that input/output line.

26. The patch panel of claim 14, wherein each input/output line is a general purpose input/output line.

27. The system of claim 14, wherein each of the input/output lines of the programmable processor is coupled to more than one of the plurality of switches.

28. The patch panel of claim 27, wherein each of the input/output lines of the programmable processor is coupled to more than one of the plurality of switches using one or more multiplexing devices.

29. The patch panel of claim 28, wherein the multiplexing device is configured to latch state changes of at least one of the plurality of switches.

30. The patch panel of claim 28, wherein the multiplexing device is configured to determine when a pair of rapid state changes occurs with respect to at least one of the plurality switches.

* * * * *